(12) United States Patent
Kasuya et al.

(10) Patent No.: US 11,780,728 B2
(45) Date of Patent: Oct. 10, 2023

(54) FORMING METHOD OF THIN LAYER

(71) Applicant: Konica Minolta, Inc., Tokyo (JP)

(72) Inventors: Jinichi Kasuya, Kokubunji (JP); Kazunari Tada, Hachioji (JP); Yasushi Mizumachi, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 453 days.

(21) Appl. No.: 16/896,864

(22) Filed: Jun. 9, 2020

(65) Prior Publication Data
US 2020/0408960 A1 Dec. 31, 2020

(30) Foreign Application Priority Data
Jun. 27, 2019 (JP) .................................. 2019-120509

(51) Int. Cl.
*B81C 1/00* (2006.01)
*G02B 1/115* (2015.01)

(52) U.S. Cl.
CPC .......... *B81C 1/00396* (2013.01); *G02B 1/115* (2013.01)

(58) Field of Classification Search
CPC ............ B81C 1/00396; B81C 1/00531; B81C 2201/0132; B81C 2201/0198
See application file for complete search history.

(56) References Cited

U.S. PATENT DOCUMENTS

| | | | | |
|---|---|---|---|---|
| 5,661,596 A | * | 8/1997 | Biro | G02B 1/115 359/359 |
| 9,372,285 B2 | | 6/2016 | Warashina et al. | |
| 2008/0085477 A1 | * | 4/2008 | Verhaverbeke | H01L 21/67207 430/322 |
| 2010/0075114 A1 | * | 3/2010 | Kurihara | B29C 45/263 977/700 |
| 2014/0097520 A1 | * | 4/2014 | Millward | H01L 21/3081 257/E21.258 |
| 2015/0048049 A1 | * | 2/2015 | Nishimura | H01J 37/32366 216/37 |
| 2016/0343887 A1 | * | 11/2016 | Hossain | H01L 31/02168 |
| 2017/0246615 A1 | * | 8/2017 | Eddaoudi | B01J 20/3071 |
| 2018/0267210 A1 | * | 9/2018 | Takeuchi | G03F 7/0043 |

FOREIGN PATENT DOCUMENTS

| | | |
|---|---|---|
| JP | S62-60224 A | 3/1987 |
| JP | 2000-036243 A | 2/2000 |
| JP | 2003-287601 A | 10/2003 |

(Continued)

OTHER PUBLICATIONS

EPO, Extended European Search Report for the corresponding European patent application No. 20178095.4, dated Oct. 27, 2020.

(Continued)

*Primary Examiner* — Binh X Tran
(74) *Attorney, Agent, or Firm* — LUCAS & MERCANTI, LLP

(57) ABSTRACT

A forming method of a thin layer with a pore is provided. The method includes forming a thin layer on a substrate, stacking a first mask and a second mask on the thin layer in this order, and forming a pore in the thin layer by dry etching. The first mask includes at least a self-assembling material. The second mask is more resistant to reactive etching or physical etching than the first mask.

15 Claims, 7 Drawing Sheets

(56) References Cited

FOREIGN PATENT DOCUMENTS

| | | |
|---|---|---|
| JP | 2006-245342 A | 9/2006 |
| JP | 2008-043873 A | 2/2008 |
| JP | 2008-047822 A | 2/2008 |
| JP | 2008-168610 A | 7/2008 |
| JP | 2013-207089 A | 10/2013 |
| JP | 2015-227904 A | 12/2015 |
| KR | 101449515 B1 | 10/2014 |
| WO | 2016/170727 A1 | 10/2016 |
| WO | 2017/056598 A1 | 4/2017 |

OTHER PUBLICATIONS

Office Action dated Jan. 31, 2023 for the related Japanese Application No. 2019-120509, with an English translation.
European Patent Office, Office Action issued for the related European Patent Application No. 20178095.4, dated Mar. 24, 2023 (4 pages).
Office Action issued for the related Chinese Patent Application No. 202010580125.1, dated Mar. 24, 2023, with English translation (18 pages).

* cited by examiner

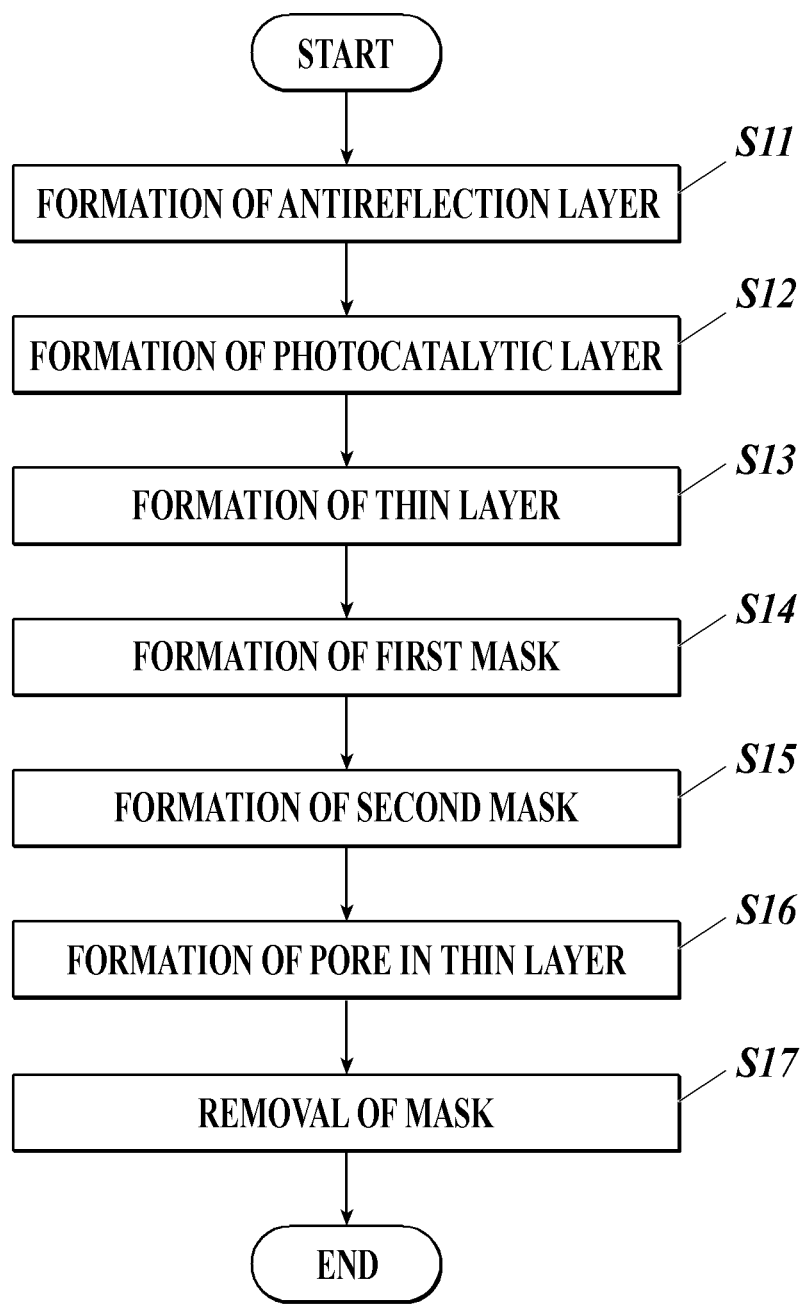

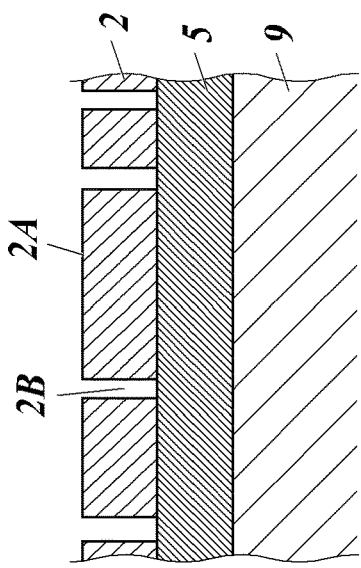
FIG.7E
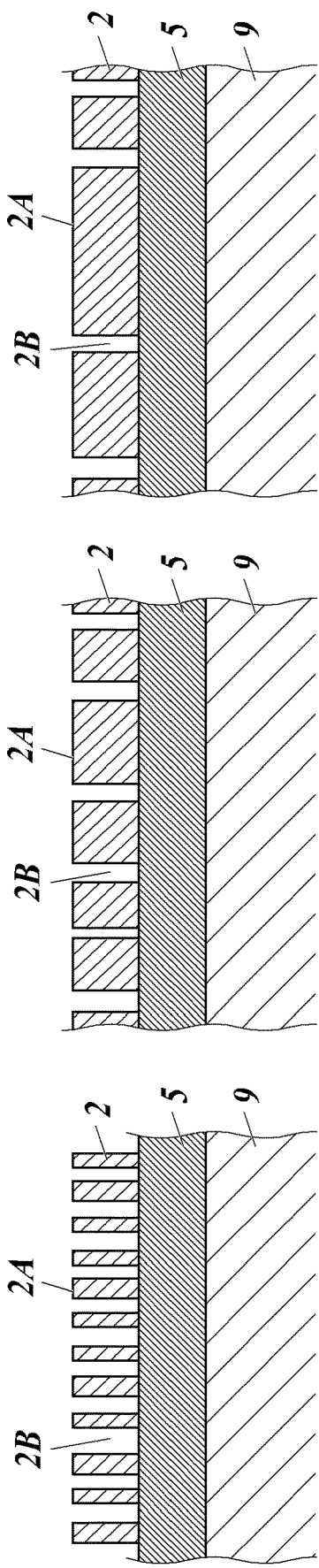
FIG.7C
FIG.7A
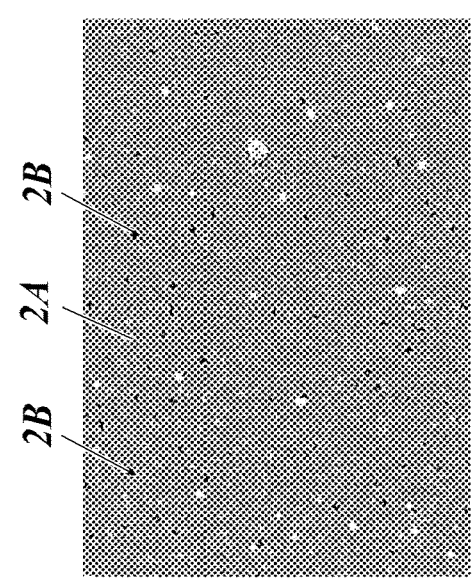
FIG.7F
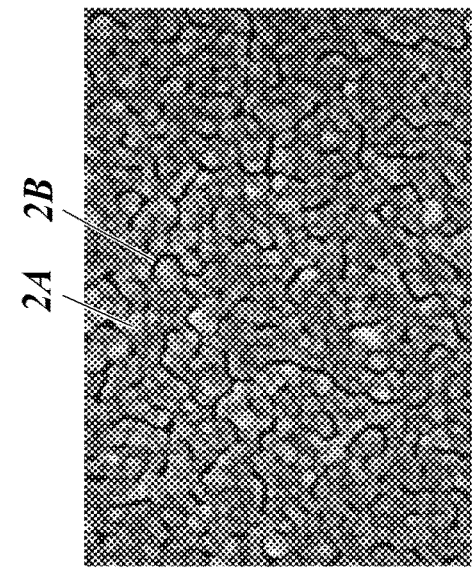
FIG.7D
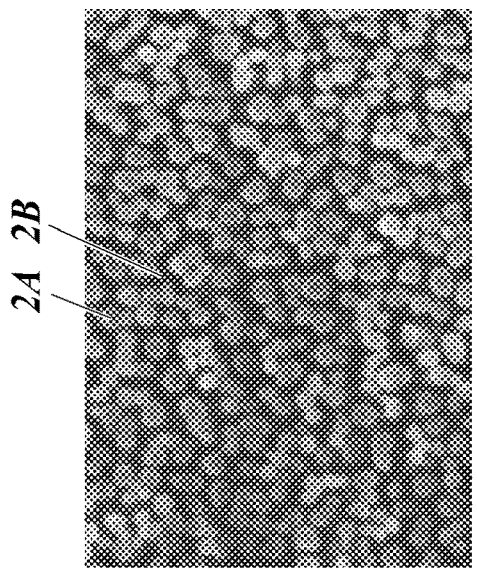
FIG.7B

FORMING METHOD OF THIN LAYER

CROSS-REFERENCE TO RELATED APPLICATIONS

Japanese Patent Application No. 2019-120509, filed on Jun. 27, 2019 with Japan Patent Office, is incorporated herein by reference in its entirety.

BACKGROUND

Technological Field

The present invention relates to a forming method of a thin layer. More specifically, the present invention relates to a forming method of a high-quality thin layer with a pore(s) by using a first mask and a second mask that have excellent etching resistance.

Description of the Related Art

In recent years, an in-vehicle camera is mounted on a vehicle to support driving of the vehicle. Specifically, a camera mounted on a vehicle captures images of rear and sides of the vehicle, and the captured images are displayed at a position visible to the driver. This reduces blind spots and contributes to safe driving.

Because such an in-vehicle camera is usually mounted outside the vehicle, a lens used in the camera is demanded to have environmental resistance. For example, when silicon dioxide (hereinafter abbreviated as $SiO_2$), as a component of an antireflection layer on the lens surface is dissolved in salt water, ghost and flare are caused due to variation in light reflectance.

Furthermore, the lens is often soiled with water droplets, mud, and the like. Depending on the amount of water droplets on the lens, the images taken by the camera may be unclear. Therefore, the uppermost layer of the antireflection layer is required to maintain superhydrophilicity for a long period of time.

Furthermore, the antireflection layer preferably exhibits a photocatalytic effect against dirt such as mud and has a self-cleaning property.

In order to solve these problems, for example, JP H10-36144 A discloses a method including the following steps: production of a laminate of a substrate, a dielectric multi-layer (antireflection layer), a layer including $TiO_2$ (photocatalytic layer), and a layer including $SiO_2$; formation of a metal mask on the $SiO_2$ layer; and after that, etching the $SiO_2$ layer to make atomic level holes as through holes through which photocatalytic function of the $TiO_2$ containing layer is exhibited on the surface. The $SiO_2$ layer can be formed in a specific shape, for example, by using a mask that is a self-assembled layer having a fine structure and formed using a vacuum vapor deposition device without performing an exposure process. The through holes for exhibiting the photocatalytic function of the $TiO_2$ containing layer in $SiO_2$ layer may be formed, for example, by dry etching from the upper surface side of a metal mask that is formed on the $SiO_2$ layer, uses silver as a metal component, and has a particulate pattern, a leaf vein pattern, or a porous pattern.

However, a metal mask is likely to be damaged during etching due to its low etching resistance. This results in low etching accuracy and causes a problem that it is difficult to form through holes having a desired shape.

In order to solve the above problem, for example, JP 2008-43873 A discloses a pattern forming method by using an etching mask obtained by self-assembling of a block copolymer. JP 2013-207089 A also discloses a periodic pattern forming method by using a mask of a first polymer and a second polymer of a block polymer-copolymer capable of self-assembling.

However, the above-described methods still has problems in forming high-quality through holes because the mask does not have enough etching resistance to be formed in a desired fine structure.

Therefore, it is desired to develop a mask that has excellent etching resistance and that can form a fine structure with high accuracy without an exposure process.

SUMMARY

The present invention has been made in view of the above problems and circumstances, and the object of the present invention is to provide a forming method of a thin layer that prevents abrasion or defect of a mask used to form a pattern on the thin layer during dry etching and that is capable of forming a thin layer having fine structure pores with high accuracy.

In the process of examining causes and solutions of the above problems, the present inventors have reached the present invention, which provides a forming method of a thin layer with pores including forming a thin layer on a substrate and stacking a mask including a first mask and a second mask on the thin layer. The first mask includes at least a self-assembling material to have a desired shape and the second mask is more resistant to reactive etching or physical etching than the first mask. This method makes it possible to prevent wear and damage of a mask due to dry etching and to form a thin layer having a fine structure pore with high accuracy during patterning of the thin layer.

The above-mentioned object of the present invention is solved as follows.

To achieve at least one of the above-mentioned objects, a forming method of a thin layer with pores reflecting one aspect of the present invention includes:
  forming a thin layer on a substrate;
  stacking a first mask and a second mask on the thin layer in this order, the first mask including at least a self-assembling material and the second mask being resistant to reactive etching or physical etching than the first mask; and
  forming a pore in the thin layer by dry etching.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention, wherein:

FIG. 5 is a flowchart showing a process of forming a pore in a dielectric multilayer including the thin layer;

FIG. 7A to FIG. 7F are schematic diagrams showing examples of a patterned thin layer each having a particulate shape, a leaf vein shape, or a porous shape.

DETAILED DESCRIPTION OF THE EMBODIMENTS

Figure 1A:
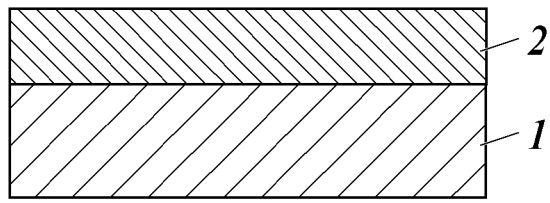
FIG. 1A to FIG. 1E are schematic diagrams showing an example of a forming method of a thin layer with pores by using two masks according to the present invention.

Hereinafter, one or more embodiments of the present invention will be described with reference to the drawings. However, the scope of the invention is not limited to the disclosed embodiments.

The forming method of a thin layer of the present invention is a forming method of a thin layer with a pore(s) including: forming a thin layer on a substrate; stacking a first mask and a second mask on the thin layer in this order, the first mask including at least a self-assembling material and the second mask being resistant to reactive etching or physical etching than the first mask; and forming a pore in the thin layer by dry etching. This is a technical feature common to or corresponding to the following embodiments.

In an embodiment of the present invention, from the viewpoint of exhibiting effects of the present invention, a forming method of a thin layer preferably includes, after stacking the first mask and the second mask, expanding a hole in the first mask through which the thin layer is exposed, and more preferably, the hole is expanded by annealing at a temperature of 100° C. or more for one minute or more. This prevents reduction in etching efficiency at groove portions formed by the second mask.

Furthermore, the self-assembling material is preferably silver. As a result, it is possible to form a mask having various patterns (for example, in a particulate shape, a leaf vein shape, or a porous shape) and thereby to form pores of the thin layer by setting the layer thickness of the mask to a desired level.

The "particulate shape" as used in the present invention refers to a structure in which the material for forming the mask is formed into particles independent of each other, as shown in FIG. 7B. The "leaf vein shape" refers to a structure in which the material for forming the mask is formed into a vein-like aggregate, as shown in FIG. 7D. The "porous shape" refers to a structure in which the material for forming the mask is densely arranged and has relatively few holes.

The material for forming the second mask preferably includes at least one of ZnS, LaF, YF, CeF, WO, $SiO_2$, and a mixture of $Ta_2O_5$ and $TiO_2$, more preferably includes ZnS or a mixture of $Ta_2O_5$ and $TiO_2$. As a result, the second mask has excellent resistance to the reactive etching or the physical etching, and further exhibits the effect of protecting the first mask of the self-assembling material during dry etching.

The second mask preferably has a layer thickness in a range of 0.1 to 10 nm. As a result, it is possible to protect the first mask and to remove the mask easily after etching.

The first mask and the second mask are preferably formed by a vacuum deposition method. As a result, it is possible to perform successive processes in one vacuum layer forming device, for example, processes including formation of an antireflection layer unit, a photocatalytic layer, a thin layer, a first mask, and a second mask on a substrate, and dry etching.

The thin layer preferably includes $SiO_2$ as a main component. As a result, an excellent hydrophilic function can be exhibited.

The thin layer is preferably formed on the substrate with a photocatalytic layer between the thin layer and the substrate, and the photocatalytic layer is one of a high refractive index layer including at least one of $TiO_2$, $WO_3$, ZnS, and ZnO. As a result, an excellent photocatalytic function can be exhibited.

Between the substrate and the thin layer, there is preferably formed an antireflection layer unit that includes at least one low refractive index layer and at least one high refractive index layer. As a result, an excellent light reflection function can be exhibited.

The mechanism by which the effects of the present invention is exhibited or exerted has not been revealed, but is assumed to be as follows.

The forming method of a thin layer of the present invention includes: forming a thin layer on a substrate; stacking a first mask and a second mask on the thin layer in this order, a first mask including at least a self-assembling material and the second mask being resistant to reactive etching or physical etching than the first mask; and forming pores in the thin layer by dry etching.

That is, in the first step of the forming method of pores in the thin layer, a first mask of self-assembling material is formed. This method makes it possible to easily form the first mask without using a specific mask forming means for a photolithography method, etc. By further stacking a second mask that is resistant to reactive etching or physical etching as a cover layer on the first mask, it is possible to prevent damage to the first mask due to dry etching during formation of pores in the thin layer, and to form pores having a desired shape.

The first mask and the second mask are formed by a vacuum deposition method. As a result, it is possible to perform successive processes in one vacuum layer forming device, for example, processes from formation of functional layers to formation of masks on a substrate, thereby to obtain high production efficiency.

When the second mask has a layer thickness of in the range of 0.1 to 10 nm, it does not completely fill the groove of the first mask. Furthermore, the thin layer formed on the substrate is exposed through a hole(s) in the first mask, and after the second mask is formed, the hole is expanded by annealing at a temperature of 100° C. or more for one minute or more. As a result, the second mask does not interfere the etching.

Hereinbelow, the present invention, components thereof, and embodiments and aspects for implementing the present invention will be described. However, the scope of the invention is not limited to the disclosed embodiments. In the present application, the term "to" between numerals is used to describe a numerical range including the numerical values written before and after the "to" as the lower limit and the upper limit.

<<Summary of Forming Method of Thin Layer with Pores>>

The forming method of a thin layer with pores of the present invention is a forming method of a thin layer with pores by using masks, including: forming a thin layer on a substrate; stacking a first mask and a second mask on the thin layer in this order, the first mask including at least a self-assembling material and the second mask being resistant to reactive etching or physical etching; and forming pores in the thin layer by dry etching. This is a technical feature common to or corresponding to the following embodiments.

The self-assembling material constituting the first mask of the present invention is a material that can form a fine structure by itself without the electron beam exposure (EB exposure) or a wet method such as the photolithography method. The term "self-assembly (self-organization)" as used in the present invention means that a groove or hole having a width of 10 μm or less can be formed autonomously without exposure to light or development. More preferably, it means that an average width of pores is 1 to 1000 nm. Far more preferably, it means that an average period of pores is 20 to 5000 nm. The term refers to a phenomenon of creating an ordered structure, and may be called spontaneous order formation.

The self-assembling material includes relatively small molecules that spontaneously assemble and form a higher-order structure, and examples thereof include supramolecules, self-assembled monolayers (SAM), micelle crystals, block copolymers, and the like. The self-assembling material is used for preparing a mesoporous material and the like. In the present invention, silver (Ag) is used as the self-assembling material, and the layer forming conditions (specifically, the layer thickness) are appropriately adjusted to form Ag masks of various patterns. For example, the first mask made of Ag has a "particulate pattern" when having a layer thickness of about 2 nm, a "leaf vein pattern" when having a layer thickness of about 10 nm, and a "porous pattern" when having a layer thickness of about 15 mm.

The mask forming method by using this self-assembling material enables mass production of nanodevices as compared with a conventionally used wet forming method such as photolithography.

The second mask according to the present invention is more resistant to the reactive etching or the physical etching than the first mask. The "reactive etching" is performed by chemical reaction including emission of plasma or ions under vacuum, for example, by conversion of $SiO_2$ into $SiF$ gas using a fluorine-based gas turned into plasma. The "physical etching" is performed without chemical reaction under vacuum, for example, by using Ar or $O_2$ turned into plasma.

The "thin layer" of the present invention is not particularly limited. The thin layer having a pattern according to the present invention is used as, for example, an uppermost layer that imparts hydrophilicity to a dielectric multilayer that is used to prevent organic substances adhering to an optical member from contaminating optical systems as dirt. The thickness of the thin layer according to the present invention is not particularly limited, but is preferably in the range of 10 to 300 nm.

For example, when the dielectric multilayer is composed of a reflective layer laminate including a low refractive index layer and a high refractive index layer, a photocatalytic layer having a photocatalytic function, and an uppermost layer, the uppermost layer is preferably the thin layer having the pattern according to the present invention and is the low refractive index layer. The "low refractive index layer" in the present invention means a layer having a refractive index of less than 1.7 measured with the so-called D line. The substrate is an optical member made of resin or glass and may have any shape. The transmittance of light having a wavelength of 550 nm is preferably 90% or more.

Under the thin layer of the present invention in the typical structure described above, there is provided a photocatalytic layer having a photocatalytic function (hereinafter, also referred to as "functional layer") that is preferably a high refractive index layer including $TiO_2$ and the like. The "high refractive index layer" in the present invention means a layer having a refractive index of 1.7 or less measured with the so-called D line.

After electron emission in response to irradiation of $TiO_2$ in the photocatalytic layer with ultraviolet rays, highly oxidizing active oxygen and hydroxyl radicals (·OH radicals) are generated and degrade organic substances. In the present invention, for example, adding a photocatalytic layer including $TiO_2$ to the dielectric multilayer prevents organic substances adhered to the optical member from contaminating the optical system as dirt. By forming pores in the thin layer such that the photocatalytic layer is partly exposed, a laminate excellent in hydrophilic function and photocatalytic effect can be formed.

Whether or not a photocatalytic effect is exhibited can be determined by, for example, irradiating a sample colored with a pen with UV rays (integrated light amount: 20 J) at a temperature of 20° C. and a humidity of 80% RH and evaluating the color change of the pen step by step.

The "hydrophilic function" in the present invention is evaluated by measuring the contact angle between the standard liquid (pure water) and the surface of the thin layer based on a Measurement method according to JIS R3257. The thin layer is defined to be "hydrophilic" when having a contact angle is 30° or less, and is defined to be "superhydrophilic" when having a contact angle of 15° or less. The thin layer is preferably superhydrophilic.

[Basic Procedure of Forming Thin Layer with Pores]

According to the present invention, the forming method of a thin layer having a pore by using the mask of includes the followings: after forming a thin layer on a substrate, a first mask that is made of a self-assembling material and a second mask that is resistant to reactive etching or the physical etching than the first mask are stacked on the thin layer in this order, and pores are formed in the thin layer by dry etching.

Hereinafter, a basic procedure of forming a patterned thin layer by using the mask according to the present invention will be described with reference to the drawings.

FIG. 1A to FIG. 1E are schematic diagrams showing an example of a forming method of a thin layer with pores by using two masks according to the present invention.

[Formation of Thin Layer on Substrate]

As shown in FIG. 1A, a thin layer 2 to be patterned is formed on a substrate 1.

(Substrate)

Examples of the substrate applicable to the present invention include a glass substrate or a resin substrate, and the transmittance of light having a wavelength of 550 nm is preferably 90% or more.

(Forming Method of Thin Layer)

The forming method of the thin layer is not particularly limited and may be a wet method or a dry method, but the dry method is preferably used. For example, known dry methods include a method based on vapor deposition such as a vacuum deposition method, an ion beam deposition method, and an ion plating method, and a method based on sputtering such as a sputtering method, an ion beam sputtering method, and a magnetron sputtering method. The layer forming method for forming the thin layer according to the present invention is preferably an ion-assisted vapor deposition method (hereinafter, also referred to as IAD method in the present application) or a sputtering method. In particular, when the thin layer is the uppermost layer made of SiO$_2$, it is preferable to form a high-density layer by using the IAD method.

In the present invention, the layer density can be particularly increased by forming the thin layer by using the IAD method, the sputtering method, or the like.

In the IAD method, application of high kinetic energy of ions during layer formation makes the layer to be dense and to have enhanced adhesion. For example, in the IAD method using an ion beam, an adhering material is accelerated by ionized gas emitted from an ion source to form a layer on the surface of the substrate.

Figure 3:
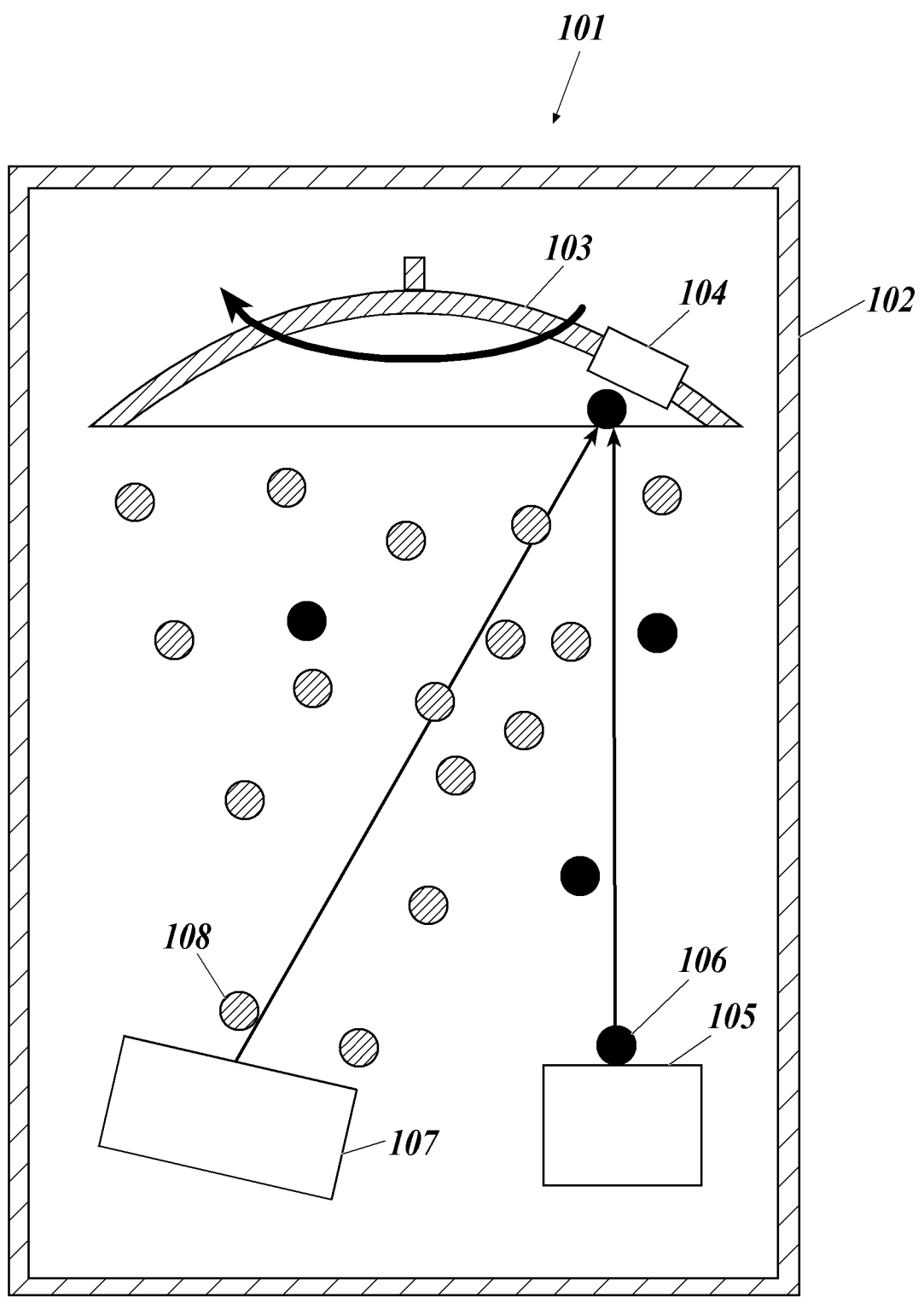
FIG. 3 is a schematic diagram showing an example of a vacuum vapor deposition device using the IAD method used in the present invention.

FIG. 3 is a schematic diagram showing an example of a vacuum vapor deposition device using the IAD method.

A vacuum vapor deposition device 101 using the IAD method (hereinafter, also referred to as an IAD vapor deposition device in the present application) includes a dome 103 in a chamber 102, and a substrate 104 is arranged along the dome 103. A vapor deposition source 105 includes an electron gun or a resistance heating device for vaporizing a vapor deposition material 106. The vapor deposition material 106 is scattered from the vapor deposition source 105 toward the substrate 104, and is condensed and solidified on the substrate 104. At that time, the ion beam 108 is emitted from the IAD ion source 107 toward the substrate 104, and the high kinetic energy of the ions is applied during the layer formation to form a dense layer and to enhance the adhesion of the layer.

The substrate 104 used in the present application is made of glass or resin such as polycarbonate resin and cycloolefin resin, for example, and is preferably an in-vehicle lens.

Although one vapor deposition source 105 is shown in the drawing, a plurality of vapor deposition sources 105 may be arranged at the bottom of the chamber 102. The vapor deposition substance 106 is generated from the layer forming material (vapor deposition material) of the vapor deposition source 105 by an electron gun or a resistance heating device, and is scattered and adheres to the substrate 104 (for example, a lens) placed in the chamber 102 to form a layer of the layer forming material (for example, a low refractive index material such as SiO$_2$, MgF$_2$, or Al$_2$O$_3$, or high refractive index material such as Ta$_2$O$_5$ or TiO$_2$) on the substrate 104.

According to the present invention, a layer 2 including SiO$_2$ as a main component is preferably formed with a SiO$_2$ target arranged in the vapor deposition source 105. In order to further improve the hydrophilic function, the SiO$_2$ is preferably mixed with an element having less electronegativity than Si, for example, sodium, magnesium, potassium, lithium, or calcium.

When sodium is added to SiO$_2$, an SiO$_2$ target including sodium is prepared and placed in a vapor deposition source for direct vapor deposition. Alternatively, the SiO$_2$ target and a sodium target may be separately arranged, such that SiO$_2$ and sodium are co-evaporated. In the present invention, it is preferable to prepare an SiO$_2$ target including sodium and place the target in a vapor deposition source for direct vapor deposition, from the viewpoint of adding sodium with high accuracy.

It is preferable to use Na$_2$O as a sodium source, MgO as a magnesium source, K$_2$O as potassium source, LiO$_2$ as lithium source, and CaO as calcium source. Commercially available ones may be used.

the chamber 102 has a vacuum exhaust system (not shown) that evacuates the inside of the chamber 102.

The pressure in the chamber is usually reduced to be in a range of $1\times10^{-4}$ to $1\times10^{-1}$ Pa, preferably $1\times10^{-3}$ to $1\times10^{-2}$ Pa.

The dome 103 may be called a vapor deposition umbrella, and holds at least one holder (not shown) that holds the substrate 104. The dome 103 has an arc-shaped cross section and is rotationally symmetrical so as to rotate about a rotational symmetry axis that passes through the center of a chord connecting the ends of the arc-shaped cross section and is perpendicular to the chord. When the dome 103 rotates about the axis at a constant rate, for example, the substrate 104 held on the dome 103 via the holder rotates around the axis at a constant rate.

It is possible to hold a plurality of holders on the dome 103 side by side in the rotation radius direction or in the rotation direction. As a result, it is possible to simultaneously form layers on a plurality of substrates 104 held by the plurality of holders and to improve efficiency in producing the laminate.

The IAD ion source 107 is a device that ionizes argon gas or oxygen gas introduced into the main body and emits the ionized gas (ion beam 108) toward the substrate 104. The argon gas or oxygen gas may be also used as a neutralizer that electrically neutralizes the positive charges accumulated on the substrate in order to prevent the entire substrate from being positively charged (a phenomenon called charge-up) due to accumulation of positive ions emitted from the ion gun on the substrate.

As the ion source may be used a Kauffman type (filament), a hollow cathode type, an RF type, a bucket type, a duoplasmatron type, or the like. When the above gas emitted from the IAD ion source 107 onto the substrate 104, for example, molecules of the layer-forming material having evaporated from a plurality of evaporation sources can be pressed against the substrate 104. As a result, a layer having high adhesion and denseness can be formed on the substrate 104. The IAD ion source 107 is placed in the chamber 102 at a position facing the substrate 104 in the drawing, but may be placed at a position not facing the substrate 104.

In the IAD method, for example, an ion beam with an accelerating voltage of 100 to 2000 V, an ion beam with a current density of 1 to 120 µA/cm$^2$, or an ion beam with an accelerating voltage of 500 to 1500 V and a current density of 1 to 120 µA/cm$^2$ can be used. In the layer forming step, the ion beam may be emitted, for example, for 1 to 800 seconds, and the number of particles in the emitted ion beam may be, for example, $1\times10^{13}$ to $5\times10^{17}$ particles/cm$^2$. The ion beam used in the layer forming step is, for example, an oxygen ion beam, an argon ion beam, or an oxygen/argon mixed gas ion beam. Preferably, oxygen is introduced in the range of 30 to 60 sccm, and argon introduced in the range of 0 to 10 sccm. The unit "SCCM" is an abbreviation for "standard cc/min", and indicates flowing amount (cc) per minute at 1 atm (atmospheric pressure, 1013 hPa) and 0° C.

A monitor system (not shown) monitors the layer attached to itself because of the evaporation from each evaporation source 105 during vacuum layer formation so as to monitor the wavelength characteristic of the layer formed on the substrate 104. With this monitor system, it is possible to grasp the optical characteristics (for example, spectral transmittance, light reflectance, optical layer thickness, etc.) of the layer formed on the substrate 104. The monitor system also includes a crystal layer thickness monitor, so as to monitor the physical layer thickness of the layer formed on the substrate 104. This monitor system also functions as a controller that controls ON/OFF switching of the plurality of evaporation sources 105, ON/OFF switching of the IAD ion source 7, and the like depending on the result of monitoring the layer.

In the sputtering method, the thin layer can be formed by bipolar sputtering, magnetron sputtering, dual magnetron sputtering (DMS) using an intermediate frequency region, ion beam sputtering, ECR sputtering, and the like, alone or in combination of two or more. The target application method is appropriately selected according to the target type, and either DC (direct current) sputtering or RF (high frequency) sputtering may be used.

The sputtering method may be multi-source simultaneous sputtering using a plurality of sputtering targets. The preparing method of these sputtering targets and the forming method of a thin layer using these sputtering targets are disclosed in, for example, JP2000-160331A, JP2004-068109A, JP2013-043761A.

(Structure of Thin Layer)

The thin layer of the present invention constitutes the uppermost layer, and there is no particular limitation on its configuration. However, when the thin layer forms the uppermost layer of the dielectric multilayer film described later, it is preferably a low refractive index layer composed of a material having a refractive index of less than 1.7. In the present invention, a layer containing $SiO_2$ as a main component is particularly preferable.

The "layer containing $SiO_2$ as a main component" according to the present invention means a layer containing 51% by mass or more of $SiO_2$ with respect to the entire thin layer, more preferably 70% by mass or more, and particularly preferably 90% by mass or more.

The composition of the thin layer according to the present invention can be analyzed by an ordinary method using the following X-ray photoelectron spectroscopy (XPS) analyzer.

<XPS Composition Analysis>

Device name: X-ray photoelectron spectroscopy (XPS) analyzer.
Device type: Quantera-SXM
Device manufacturer: ULVAC-PHI Inc.
Measurement conditions: X-ray source is monochromatic AlKα ray, 25 W, 15 kV
Vacuum level: $5.0 \times 10^{-8}$ Pa
Depth analysis is performed by argon ion etching. MultiPak manufactured by ULVAC-PHI, Inc. is used for data processing.

However, the thin layer according to the present invention may further contain another metal oxide, and is preferably a mixture of $Al_2O_3$ and $SiO_2$, or $MgF_2$ from the viewpoint of light reflectance.

[Formation of First Mask]

Figure 1B:
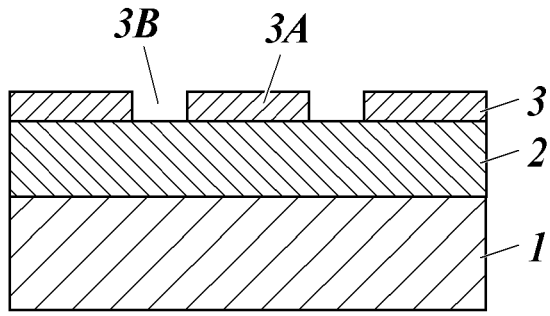

Next, as shown in FIG. 1B, a first mask 3 is formed on the thin layer 2. The first mask 3 of the present invention is composed of at least the self-assembling material. For example, the self-assembling material is applied in the form of particles to the surface of the thin layer 2 to form the nano-sized first mask 3.

The layer thickness of the first mask is preferably in the range of 1 to 100 nm, more preferably 10 to 40 nm.

When the layer thickness of the first mask 3 is 1 nm or more, the thickness required for the mask is satisfied, so that the protective effect is more easily exhibited. When the layer thickness is 100 nm or less, the first mask 3 can be reliably removed by selective etching for removing the mask (Material for Forming First Mask)

The first mask 3 of the present invention can be formed of, for example, Ag, Al, or the like, and is particularly preferably formed of Ag.

(Forming Method of First Mask)

When formed to have a layer thickness of about 2 nm by vapor deposition under certain layer forming conditions, for example, the first mask 3 (mask portion 3A) tends to have a particulate shape (see, for example, FIGS. 7A and 7B described later). Alternatively, for example, when formed to have a layer thickness of 10 to 12 nm using the vapor deposition method, the first mask 3 tends to have a leaf vein shape (see, for example, FIGS. 7C and 7D described later). Further alternatively, for example, when formed to have a layer thickness of about 15 nm by vapor deposition, the first mask 3 (3A) tends to have a porous shape (see, for example, FIGS. 7E and 7F described later). By forming the metal into a layer having a thickness within the above ranges, it is possible to easily form the optimum first mask 3 having a particulate shape, a leaf vein shape, or a porous shape.

The first mask 3 of Ag layer can be formed into a particulate shape, a leaf vein shape, or a porous shape by changing the layer thickness to be formed using a layer forming device (BES-1300 manufactured by Syncron Co., Ltd.), for example. The thin layer 2 formed on the substrate is exposed through the hole 3B.

[Formation of Second Mask]

Figure 1C:
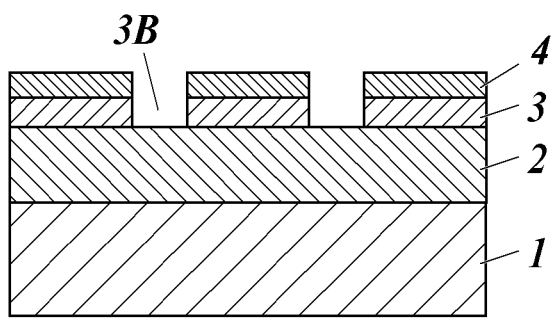

Next, as shown in FIG. 1C, a second mask 4 that is resistant to reactive etching or the physical etching is formed on the first mask 3 (mask portion 3A). The second mask 4 serves as a cover layer for preventing the first mask 3 from being affected by the reactive gas (for example, $CHF_3$) used for dry etching in the next step of forming a patterned thin layer with pores using a dry etching device (FIG. 1D).

(Material for Forming Second Mask)

The material for forming the second mask 4 according to the present invention is not particularly limited as long as the second mask 4 is as described above, but preferably includes at least one of ZnS, LaF, YF, CeF, WO, $SiO_2$, and a mixture of $Ta_2O_5$ and $TiO_2$, more preferably includes ZnS or a mixture of $Ta_2O_5$ and $TiO_2$.

Figure 1D:
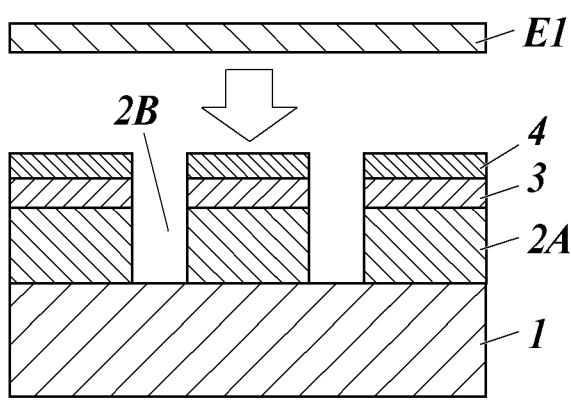

The material of the second mask 4 is selected in consideration of resistance of the layer to a reactive gas such as $CHF_3$ that is used for dry etching in the next step (FIG. 1D). Specifically, the material of the second mask 4 and the layer thickness to be formed are determined based on a measured layer loss rate (nm/min) due to the dry etching (that is, a layer thickness corroded in a minute).

Depending on the material used, the layer thickness is preferably determined such that the second mask 4 disappears when the dry etching is completed.

The layer loss rate (nm/min) is 0.025 for ZnS, 0.008 for a mixture of $Ta_2O_5$ and $TiO_2$, 0.3 for YF, 1.3 for CeF, 0.3 for WO, and 0.6 for $SiO_2$. The lost layer rate is preferably sufficiently smaller than the Ag loss rate (nm/min), which is about 2.6. Therefore, usually, it is preferably less than 2.6 nm/min.

An example of the measurement of the layer loss rate is shown below.

After etching under the following conditions using a reactive dry etching device (CE-300I, manufactured by ULVAC-PHI Inc.), the reduction amount of the layer thickness of the second mask per unit time (minute) was obtained as the loss rate.

Antenna RF: 400 W
Bias RF: 38 W
APC pressure: 0.5 Pa
$CHF_3$ flow rate: 20 sccm
Etching time: 60 seconds (Layer Thickness of Second Mask)

In view of the above, the layer thickness of the second mask is preferably in a range of 0.1 to 10 nm. When the layer thickness of the second mask is more than 10 nm, the second mask 4 is also formed in a portion other than the first mask and prevents selective etching. When it is less than 0.1 nm, second mask cannot serve as a cover layer for the first mask (Forming Method of Second Mask)

The second mask can also be formed by the same method as the first mask, for example, by a method based on vapor deposition such as a vacuum deposition method, an ion beam deposition method, and an ion plating method, and a method based on sputtering such as a sputtering method, an ion beam sputtering method, and a magnetron sputtering method.

In some cases, the second mask of the present invention is formed not only as originally intended on the first mask but also as a sole layer on a portion where the first mask does not exist. However, because of to the directivity of the vacuum deposition method or the like, the second mask would not be formed at a deep portion of the groove of the first mask. If the second mask is formed on the portion without the first mask, the formed amount would be small. Therefore, the second mask disappears in the subsequent dry etching and does not remain in the final product.

[Annealing after Forming First Mask and Second Mask]

In the present invention, before etching of the thin layer on the substrate on which the first mask and the second mask have been formed, the holes in the first mask is preferably expanded by annealing.

Figure 2A:
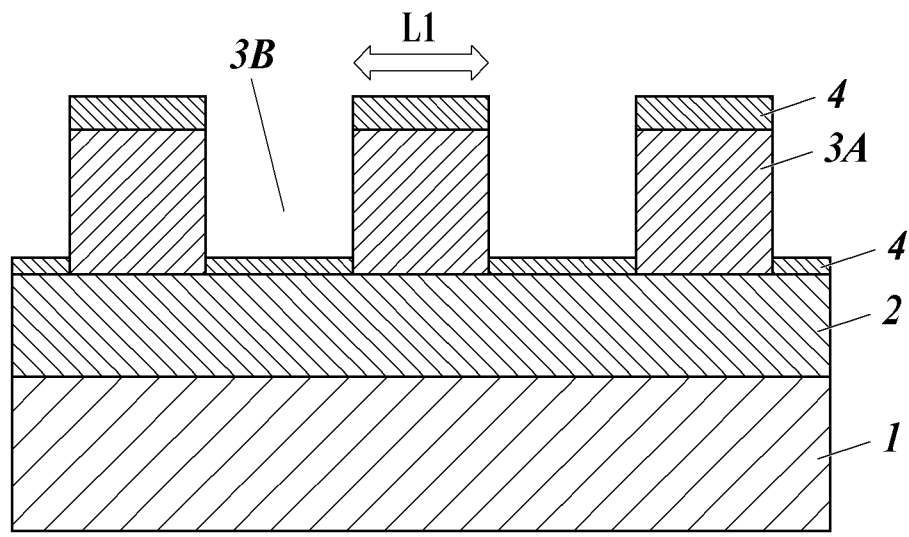
FIG. 2A and FIG. 2B are schematic diagrams showing an example of a method of annealing after forming a second mask.
Figure 2B:
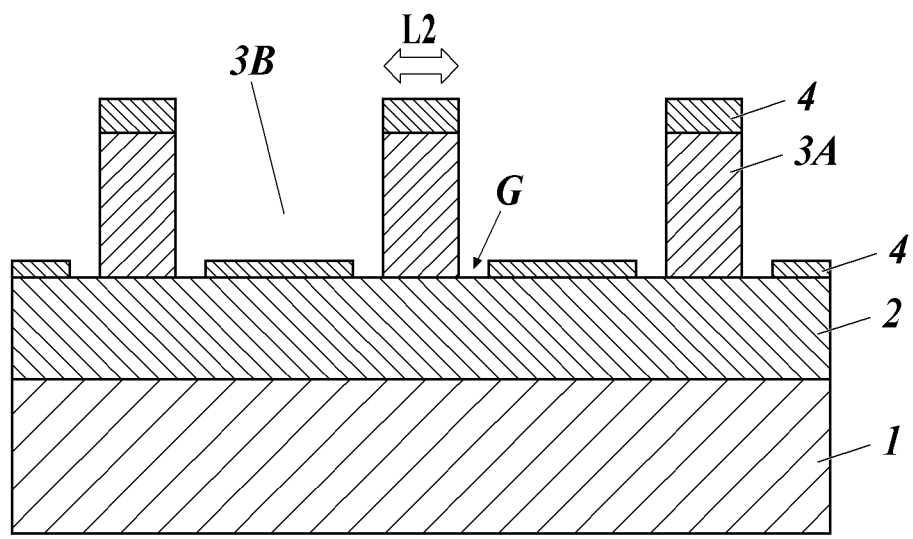

FIG. 2A to FIG. 2B are schematic diagrams showing an example of a method in which annealing is performed after forming the second mask according to the present invention.

FIG. 2A is a diagram showing the structure of the laminate before the annealing, including the thin layer 2 on the substrate 1, the first mask 3 made of the self-assembling material, and the second mask 4 formed thereon. The first mask 3 has a mask portion(s) 3A and a hole(s) 3B where the thin layer 2 is exposed. The second mask is mainly formed on the mask portion 3A, but is partly formed in the hole 3B where the thin layer 2 is exposed.

When the laminate has such a configuration, annealing is performed for expanding the hole 3B in the first mask 3. The annealing conditions are not particularly limited, but it is preferable that the temperature of 100° C. or more is maintained for one minute or more, and for example, annealing is performed at 300° C. for five minutes.

FIG. 2B shows the structure of the laminate after annealing. By the annealing, the components (for example, Ag particles) of the mask portion 3A forming the first mask 3 cause migration, and the mask portion 3A is compressed and its width decreases from L1 to L2. As a result of this compression, the gap between the mask portions 3A is expanded. Therefore, gaps G are formed in the second mask 4 formed where the first mask 3 does not exist (that is, the holes 3B where the thin layer 2 is exposed). As a result, it is possible to reduce the influence of the second mask 4 on the hole 3B where the thin layer 2 is exposed during etching of the thin layer 2, and it is possible to reliably perform the etching of the thin layer 2.

[Pattern Forming of Thin Layer by Etching]

Next, as shown in FIG. 1D, from the upper side of the laminate including the thin layer 2, the first mask 3, and the second mask 4 formed on the substrate 1 as described above, the thin layer 2 is dry-etched with the dry etching device E1 such that a fine structure(s) 2A and a pore(s) 2B are formed.

The pores 2B are formed in the thin layer 2 corresponding to the shape of the first mask 3, and the fine structure(s) 2A has a portion in the particulate shape (FIGS. 7A and 7B), the leaf vein shape (FIGS. 7C and 7D), or the porous shape (FIGS. 7E and 7F).

(Dry Etching Device)

For the dry etching, a dry etching device with an etching device is used.

In the pore forming step of the thin layer 2, a plurality of pores are formed using a gas that reacts with the material of the thin layer 2 (specifically, $SiO_2$). In this case, the $SiO_2$ of the thin layer 2 can be removed without damaging the first mask 3 and the second mask 4. As the etching gas, for example, $CHF_3$, $CF_4$, $COF_2$, $SF_6$ or the like is used. As a result, when the functional layer 5 is formed below the thin layer 2 as shown in FIGS. 4B and 4C, for example, the surface of the functional layer 5 is exposed though the plurality of the formed pores 2B. That is, the pore 2B and the fine structure 2A of $SiO_2$ that is the material for forming the thin layer 2 are formed corresponding to etching of the thin layer 2 at portions exposing through the first mask 3 and the second mask 4, so that the surface of the functional layer 5 is partially exposed.

(Dry Etching Method)

Examples of dry etching include plasma etching, ion etching, reactive ion etching, and sputter etching.

An example of dry etching is shown below.

The dry etching can be performed using, for example, CE-300I manufactured by ULVAC-PHI Inc. under the following conditions.

Antenna RF: 400 W
Bias RF: 38 W
APC pressure: 0.5 Pa
$CHF_3$ flow rate: 20 sccm
Etching time: 60 seconds

[Removal of First Mask and Second Mask]

Figure 1E:
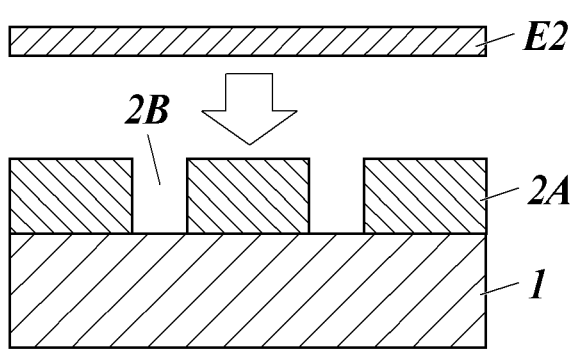

After patterning the thin layer 2, the first mask 3 and the second mask 4 are removed as shown in FIG. 1E.

Specifically, the first mask 3 and the second mask 4 are removed by etching using the etching device E2 is performed by emitting $O_2$ plasma.

(Etching Method)

Examples of thy etching include plasma etching, ion etching, reactive ion etching, and sputter etching.

An example of etching for removing each mask is shown below.

The mask material can be peeled off by emitting $O_2$ plasma in the dry etching using CE-300I manufactured by ULVAC-PHI Inc.

An example of peeling conditions is shown below.

Antenna RF: 400 W
Bias RF: 38 W
APC pressure: 0.5 Pa
$O_2$ flow rate: 50 sccm
Etching time: 600 seconds <<Example of Laminate Including Thin Layer Having Pore According to the Present Invention>>

Next, a configuration example of a laminate including the thin layer with pores according to the present invention will be described with reference to the drawings.

First Embodiment: Substrate+Thin Layer

Figure 4A:
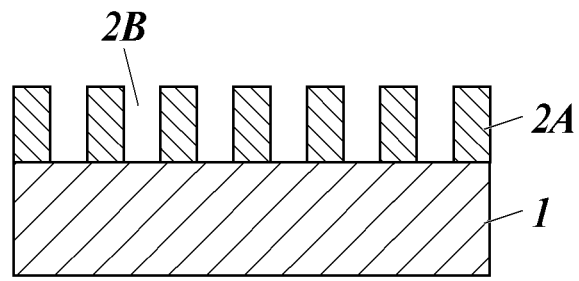
FIG. 4A to FIG. 4C are schematic diagrams showing an example of a laminate structure including a patterned thin layer using the forming method of the present invention.
Figure 4B:
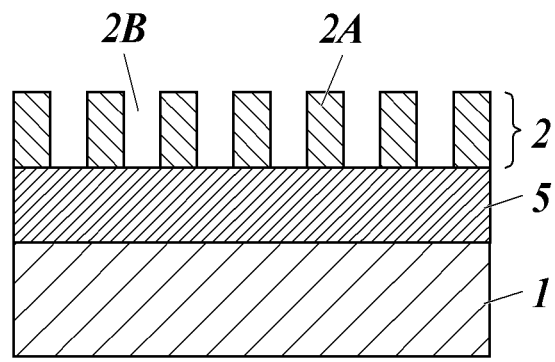
Figure 4C:
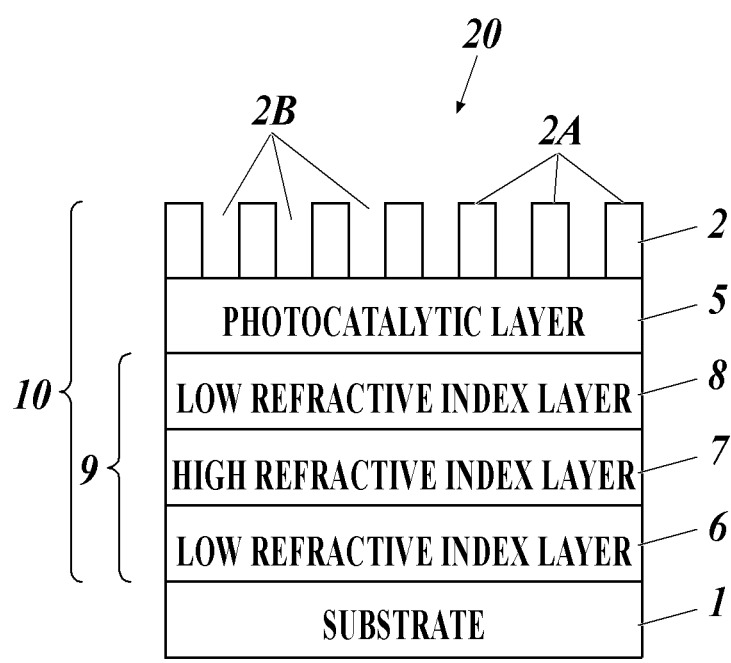

The laminate shown in FIG. 4A (first embodiment) consists of substrate 1 and thin layer 2 having fine structure 2A and pore 2B as described in FIGS. 1A to 1E, and detailed description thereof will be omitted.

Second Embodiment: Substrate+Functional Layer+Thin Layer (Uppermost Layer)

The laminate shown in FIG. 4B (second embodiment) has a photocatalytic layer 5 (also referred to as a functional layer) between the substrate 1 and the thin layer 2 having fine structures 2A and pores 2B.

The photocatalytic layer 5 according to the present invention is a functional layer having a photocatalytic function mainly composed of a metal oxide, which is a layer adjacent to the thin layer 2 (lower layer portion). The photocatalytic layer 5 can effectively exhibit the photocatalytic function and removes organic substances on the surface which are the main constituents of dirt with the metal oxide having a photocatalytic effect and a photoreactive effect. The second embodiment is preferred in that the photocatalytic layer 5 can contribute to maintaining the superhydrophilicity of thin layer 2.

The photocatalytic layer 5 preferably includes at least one of $TiO_2$, $WO_3$, ZnS, and ZnO. The photocatalytic layer 5 is particularly preferably $TiO_2$ because it has a high refractive index and can reduce the light reflectance of the dielectric multilayer.

The forming method of the photocatalytic layer can be the same as that of forming the thin layer 2 described above. For example, examples of known methods include a method based on vapor deposition such as a vacuum deposition method, an ion beam deposition method, and an ion plating method, and a method based on sputtering such as a sputtering method, an ion beam sputtering method, and a magnetron sputtering method.

Third Embodiment: Dielectric Multilayer Having Thin Layer According to the Present Invention The laminate shown in FIG. 4C (third embodiment) shows a dielectric multilayer 10 further including an antireflection layer unit 9 in the configuration shown in FIG. 4B. The antireflection layer unit 9 consists of three layers (low refractive index layer 6/high refractive index layer 7/low refractive index layer 8) between the substrate 1 and the photocatalytic layer 5, for example.

The dielectric multilayer provided with the thin layer according to the present invention has low light reflectance, hydrophilicity, and photocatalytic effect, and has excellent characteristics with respect to salt water resistance, scratch resistance, and the like. The dielectric multilayer can be applied to an optical member such as a lens, a window, or a mirror.

The dielectric multilayer having an antireflection function preferably has an antireflection layer unit in which a high refractive index layer having a higher refractive index than the substrate and a low refractive index layer having a lower refractive index than the high refractive index layer are stacked. The number of layers is not particularly limited, but is preferably 12 or less from the viewpoint of maintaining high productivity and obtaining a desired antireflection effect. The number of layers can be changed depending on the required optical performance, and is preferably about three to eight layers in order that reflectance of entire visible light is reduced. The upper limit of the number of layers is preferably 12 in that, even when laminate structure receives large stress, the layers can be prevented from peeling.

Preferred examples of the material used for forming the antireflection layer unit (high refractive index layer, low refractive index layer) according to the present invention include an oxide such as Ti, Ta, Nb, Zr, Ce, La, Al, Si, and Hf, an oxide compound combining them, and $MgF_2$. Furthermore, when different dielectric materials are stacked, a function of lowering the reflectance of the entire visible light can be exhibited.

The low refractive index layer is preferably composed of a material having a refractive index of less than 1.7 and contains $SiO_2$ as a main component in the present invention. The low refractive index layer may further contain another metal oxide, and is preferably a mixture of $Al_2O_3$ and $SiO_2$, or $MgF_2$ from the viewpoint of light reflectance.

The high refractive index layer is preferably composed of a material having a refractive index of 1.7 or more and is, for example, a mixture of Ta oxide and Ti oxide, Ti oxide, Ta oxide, a mixture of La oxide and Ti oxide, or the like. The metal oxide used in the high refractive index layer preferably hays a refractive index of 1.9 or more, and is preferably $Ta_2O_5$ or $TiO_2$, particularly preferably $Ta_2O_5$ in the present invention.

The total thickness of the laminate composed of the high refractive index layer and the low refractive index layer of the dielectric multilayer of the present invention is not particularly limited, but it is preferably 500 nm or less from the viewpoint of antireflection performance, more preferably in the range of 50 to 500 nm. When the total thickness is 50 nm or more, antireflection optical characteristics can be exhibited. When the total thickness is 500 nm or less, sensitivity error is small and large proportion of products have excellent spectral characteristics.

In the present invention, the forming method of the antireflection layer unit can be the same as that of forming the thin layer 2 described above. For example, examples of known methods include a method based on vapor deposition such as a vacuum deposition method, an ion beam deposition method, and an ion plating method, and a method based on sputtering such as a sputtering method, an ion beam sputtering method, and a magnetron sputtering method.

<<Forming Method of Dielectric Multilayer of Third Embodiment>>

Next, a forming method of a dielectric multilayer having the thin layer according to the present invention having will be more specifically described.

FIG. 5 is a flowchart showing a process of forming pores in the thin layer using two kinds of masks provided in the dielectric multilayer described in the above third embodiment. FIG. 6A to FIG. 6F are conceptual diagrams showing a forming method of the laminate (according to the third embodiment) including the forming method of the thin layer shown in FIG. 5.

FIG. 7A to FIG. 7F are cross-sectional views and SEM images of the patterned thin layer formed in the particulate shape, the leaf vein shape, or the porous shape.

First, the antireflection layer unit 9 is formed by alternately stacking the low refractive index layer and the high refractive index layer on a glass substrate, for example (antireflection layer forming step: step S11 in FIG. 5). In step S11, layers other than the thin layer 2 and the photocatalytic layer 5 in the structure shown in the third embodiment are formed. That is, the layer formed lastly in step S11 is the low refractive index layer 8 to be in contact with the bottom of the photocatalytic layer 5. The antireflection layer unit is preferably formed using any of vapor deposition methods, ion assisted vapor deposition method (IAD method), sputtering method, or the like. Depending on the configuration of the laminate including the thin layer 2, the formation of the antireflection layer unit 9 in step S11 (antireflection layer forming step: step S11) may be omitted.

Next, the photocatalytic layer 5 is formed in step S12, and subsequently, the thin layer 2 is formed as the uppermost layer (see FIG. 6A) in step S13. The forming method is preferably the IAD method or the sputtering method, and particularly preferably the IAD method.

Figure 6A:
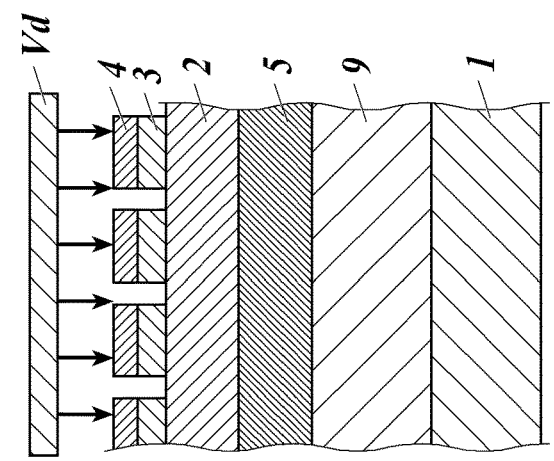
FIG. 6A to FIG. 6F are conceptual diagrams showing an example of a forming method of a laminate (according to third embodiment) including the forming method of the thin layer with pores according to the present invention.
Figure 6B:
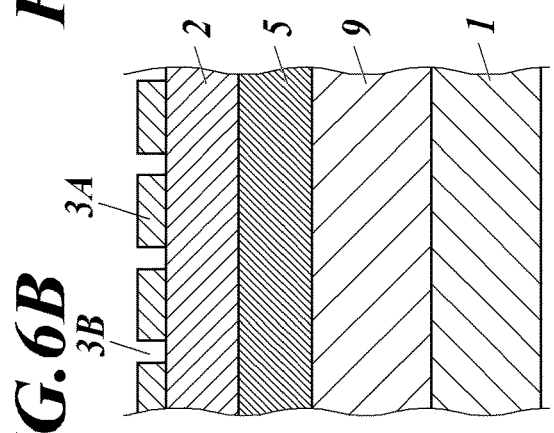
Figure 6C:
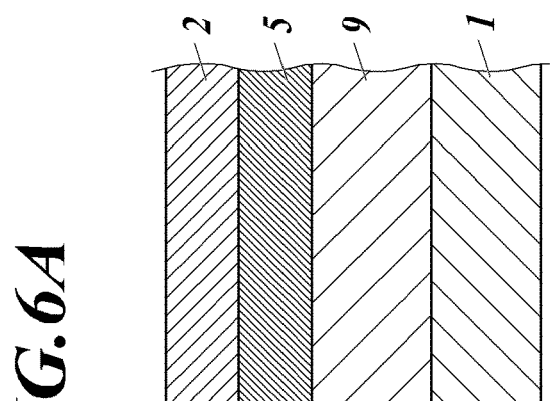

After the formation of the thin layer 2, as shown in FIG. 6B, the first mask 3 of the self-assembling material is formed on the surface of the thin layer 2 (first mask forming step: step S14). The first mask 3 formed on the surface of the thin layer 2 has appropriately adjusted layer thickness so as to have a desired shape among the particulate shape, the leaf vein shape, and the porous shape. Thus, the nano-sized first mask 3 can be formed on the thin layer 2.

The first mask 3 is composed of a mask portion(s) 3A and a hole(s) 3B where the thin layer 2 is exposed. The layer thickness of the first mask 3 is preferably in the range of 1 to 30 nm. When the first mask 3 is formed to have a layer thickness of about 2 nm by vapor deposition with Ag as a metal for layer formation under certain layer forming conditions, for example, the mask portion 3A tends to have the particulate shape (see FIG. 7A and FIG. 7B). Alternatively, for example, when the first mask 3 is formed to have a layer thickness of about 10 nm by vapor deposition, the mask portion 3A tends to have the leaf vein shape (see FIG. 7C and FIG. 7D). Further alternatively, when the first mask 3 is formed to have a layer thickness of about 15 nm by vapor deposition, the mask portion 3A tends to have the porous shape (see FIG. 7E and FIG. 7F). By forming the metal into a layer having a thickness within the above ranges, it is possible to easily form the optimum first mask 3 having the particulate shape, the leaf vein shape, or the porous shape.

In the present invention, the first mask 3 is formed of, for example, Ag or Al, and particularly preferably Ag. From the viewpoint of controlling the shape of the pores, the layer forming temperature and the layer thickness are preferably controlled in the range of 20 to 400° C. and in the range of 1 to 100 nm, respectively.

Next, in step S15, the second mask 4 that is resistant to the reactive etching or the physical etching is formed on the mask portion 3A of the first mask 3 by the vacuum vapor deposition device Vd (see FIG. 6C) in a shape that covers the mask portion 3A.

The second mask 4 serves as a cover layer for preventing the mask portion 3A of the first mask 3 from being affected by the reactive gas (for example, $CHF_3$) used for dry etching in the next step (step S16) of forming a patterned thin layer with pores using a dry etching device (FIG. 1D).

Figure 6D:
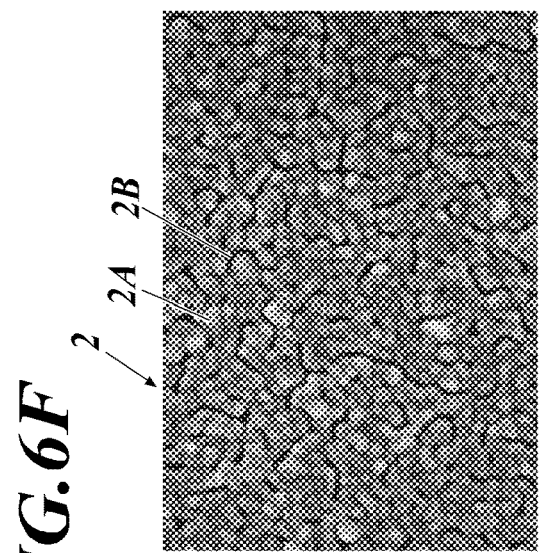

Next, in step S16, a plurality of pores 2B are formed in the thin layer 2 using the dry etching device E1. As shown in FIG. 6D, the dry etching device E1 is used for the reactive etching, and the etching gas is introduced in the device to be used. In the pore forming step, a plurality of pores 2B are formed by using a gas that reacts with the material of the thin layer 2 (i.e., $SiO_2$). In this case, the $SiO_2$ of the thin layer 2 can be removed without damaging the first mask 3 covered with the second mask 4. As the etching gas, for example, $CHF_3$, $CF_4$, $COF_2$, $SF_6$ or the like is used. As a result, the surface of the photocatalytic layer 5 is exposed though the plurality of the formed pores 2B of the thin layer 2. That is, the pore 2B and the fine structure 2A of $SiO_2$ that is the material for forming the thin layer 2 are formed corresponding to etching of the thin layer 2 at portions exposing through the first mask 3 and the second mask 4, so that the surface of the oitical functional layer 5 is partially exposed.

Figure 6E:
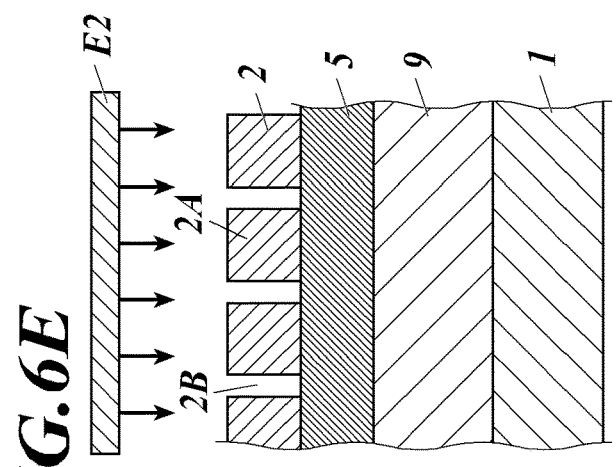
Figure 6F:
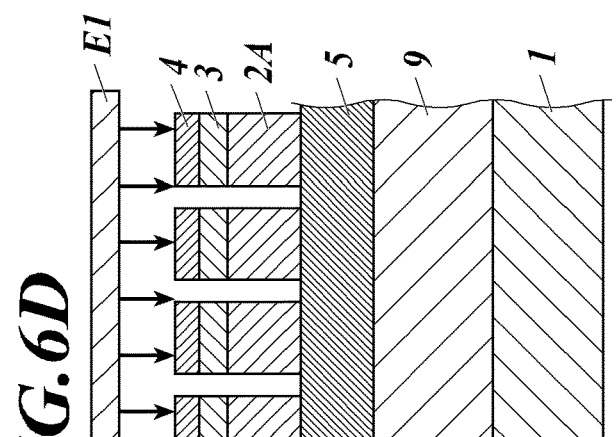

After formation of the pores 2B, in step S17, the first mask 3 and the second mask 4 are removed (see FIG. 6E). The first mask 3 and the second mask 4 can be removed by wet etching using acetic acid or the like in a specific example, but are preferably removed with a dry etching device E2 using Ar or $O_2$ as an etching gas, for example. The first mask 3 and the second mask 4 are preferably removed with the dry etching device so that the successive processes from the formation of the antireflection layer in step S11 to the removal of mask in step S17 can be performed in the same layer forming device. The thin layer 2 forming by the above method has a leaf vein pattern as in the SEM image of FIG. 6F.

Through the above steps, a dielectric multilayer having a plurality of pores 2B in the thin layer 2 can be obtained.

According to the forming method of the dielectric multilayer, the pores 2B are formed after forming the thin layer 2 such that the photocatalytic layer 5 expresses the photocatalytic function. Therefore, it is possible to achieve both superhydrophilicity and the photocatalytic function. Furthermore, the pore 2B has a size that allows the photocatalytic layer 5 to exhibit the photocatalytic function, but is not visually recognized by the user and has saltwater resistance.

FIG. 7A to FIG. 7F show examples of the patterned thin layer 2 formed by the above method. FIG. 7A and FIG. 7B respectively show a schematic cross-sectional view and an SEM image of the surface shape of the thin layer 2 formed by using the first mask having the particulate pattern. FIG. 7C and FIG. 7D respectively show a schematic cross-sectional view and an SEM image of the surface shape of the thin layer 2 formed by using the first mask having the leaf vein pattern. FIG. 7E and FIG. 7F respectively show a schematic cross-sectional view and an SEM image of the surface shape of the thin layer 2 formed by using the first mask having the porous pattern.

As described above, the dielectric multilayer having the thin layer 2 according to the present invention has low light reflectance, high hydrophilicity, and photocatalytic effect, and is also excellent in characteristics such as salt water resistance and scratch resistance. The dielectric multilayer according to the present invention is provided in an optical member (for example, a lens, a window, or a mirror) suitably used as an in-vehicle lens, a communication lens, a building material, or the like, particularly suitably as an in-vehicle lens.

EXAMPLES

Hereinafter, the present invention will be described in detail with reference to Examples, but the present invention is not limited thereto. The terms "parts" and "%" in the Examples denote, unless otherwise specified, "parts by mass" and "% by mass", respectively.

Hereinafter, specific examples of the laminate provided with the thin layer according to the present invention will be described. In the formation of the thin layer described below, "800T" manufactured by Syncron Co., Ltd. was used as a layer forming device, and "CE-300I" manufactured by ULVAC-PHI Inc. was used as a dry etching device.

<<Production of Laminate>>

[Production of Laminate 1]

Laminate 1 shown in TABLE I was produced by vapor deposition of an optical functional layer composed of $TiO_2$ and a thin layer composed of $SiO_2$ on a glass substrate TAFDSG (manufactured by HOYA Corporation: refractive index 1.835) by the IAD method under the following conditions.

(Conditions for IAD Layer Formation)
<Chamber Environment>
    Temperature for heating: 370° C.
    Starting vacuum level: 1.33×10$^{-3}$ Pa
<Evaporation Source of Layer Forming Material>
    Electron gun
(Formation of Photocatalytic Layer)
    Material for forming photocatalytic layer: $TiO_2$ (manufactured by Fuji Titanium Industry Co., Ltd. product name: T.O.P. ($Ti_3O_5$))
    The substrate was placed in the vacuum vapor deposition device. The photocatalytic layer having a thickness of 115 nm was formed on the low refractive index layer at a layer forming rate of 3 Å/sec by vapor-deposition of the material for forming the photocatalytic layer in the first evaporation source.
    The IAD method was performed using an RF ion source "OIS One" manufactured by Optolan Co., at an accelerating voltage of 1200 V, an accelerating current of 1000 mA, and a neutralization current of 1500 mA. The introduced gas for IAD included $O_2$ at 50 sccm, Ar at 10 sccm, and neutral gas at Ar 10 sccm. The photocatalytic layer was formed while heated to 370° C.
(Formation of Thin Layer)
    Material for forming thin layer: $SiO_2$ (manufactured by Canon Optron, Product name: $SiO_2$)
    The substrate was placed in the IAD vacuum vapor deposition device. The thin layer having a thickness of 88 nm was formed on the photocatalytic layer at a layer forming rate of 3 Å/sec by vapor-deposition of the material for forming the thin layer in the second evaporation source.
    The IAD method was performed using an RF ion source "OIS One" manufactured by Optolan Co., at an accelerating voltage of 1200 V, an accelerating current of 1000 mA, and a neutralization current of 1500 mA. The introduced gas for IAD included $O_2$ at 50 sccm, Ar at 10 sccm, and neutral gas at Ar 10 sccm.
(Formation of First Mask)
    The first mask of Ag as a material for forming mask having a thickness of 10 nm was formed using the layer forming device "800T" manufactured by Syncron Co., Ltd. under the following conditions.
    Temperature for heating: 300° C.
    Vacuum level at start: 1.33×10$^{-3}$ Pa
    Layer Forming Rate: 3 Å/sec
(Formation of Pore in Thin Layer by Etching)
    Etching was performed under the following conditions using the reactive dry etching device (CE-300I manufactured by ULVAC-PHI, Inc.) to form pores in the thin layer corresponding to the pattern of the first mask.
    Antenna RF: 400 W
    Bias RF: 38 W
    APC pressure: 0.5 Pa
    $CHF_3$ flow rate: 20 sccm
    Etching time: 60 seconds
(Removal of First Mask)
    After forming the pores, the first mask of Ag was peeled off by $O_2$ plasma emission using the etching device (CE-300I, manufactured by ULVAC-PHI Inc.) to produce Laminate 1. The first mask was removed under the conditions.
    Antenna RF: 400 W
    Bias RF: 38 W
    APC pressure: 0.5 Pa
    $O_2$ flow rate: 50 sccm
    Etching time: 600 seconds

[Production of Laminate 2]
    Laminate 2 was produced in the same manner as Laminate 1 except that the layer forming conditions under which the first mask (Ag) was formed were appropriately changed so that the layer thickness was 39 nm.
[Production of Laminate 3]
    Laminate 3 was produced in the same manner as Laminate 2 except that the second mask of H4 as a material for forming mask having a layer thickness of 1 nm was formed on the first mask (Ag) using "800T" manufactured by Syncron Co., Ltd. as the layer forming device under the following conditions.
(Conditions for Layer Formation)
<Chamber Environment>
    Temperature for heating: 300° C.
    Starting vacuum level: 1.33×10$^{-3}$ Pa
<Evaporation Source of Layer Forming Material>
    Electron gun
(Formation of Second Mask)
    Material for forming second mask: H4 (manufactured by Merck, product name: H4, mixture of $Ta_2O_5$ and $TiO_2$)
    The substrate was placed in the vacuum vapor deposition device. The second mask having a thickness of 1.0 nm was formed at a layer forming rate of 1 Å/sec by vapor-deposition of the material for forming the second mask in the third evaporation source.
[Production of Laminate 4]
    Laminate 4 was produced in the same manner as Laminate 3 except that, before etching of the thin layer on which the first mask and the second mask have been formed, annealing was performed at 300° C. for five minutes under atmospheric pressure.
[Production of Laminate 5]
    Laminate 5 was produced in the same manner as Laminate 3 except that the layer forming conditions under which the thin layer was formed were changed as follows and the layer thickness of the first mask was changed to 3 nm
(Formation of Thin Layer)
    Material for forming thin layer: Particles prepared from a mixture of $SiO_2$ and $Na_2O$ at a mass ratio of 90:10 (manufactured by Toshima Manufacturing Co., Ltd., Product name: $SiO_2$—$Na_2O$).
    The substrate was placed in the IAD vacuum vapor deposition device. The thin layer having a thickness of 88 nm was formed on the photocatalytic layer at a layer forming rate of 3 Å/sec by vapor-deposition of the material for forming the thin layer in the fourth evaporation source.
    The IAD method was performed using an RF ion source "OIS One" manufactured by Optolan Co., at an accelerating voltage of 1200 V, an accelerating current of 1000 mA, and a neutralization current of 1500 mA. The introduced gas for IAD included $O_2$ at 50 sccm, Ar at 10 sccm, and neutral gas at Ar 10 sccm.
[Production of Laminate 6]
    Laminate 6 was produced in the same manner as Laminate 5 except that the layer thickness of the first mask was changed to 39 nm and the layer thickness of the second mask was changed to 10 nm.
[Production of Laminate 7]
    Laminate 7 was produced in the same manner as Laminate 5 except that the layer thickness of the first mask was changed to 39 nm.
[Production of Laminate 8]
    Laminate 8 was produced in the same manner as Laminate 7 except that, before etching of the thin layer on which the first mask and the second mask have been formed, annealing was performed at 300° C. for five minutes under vacuum.

[Production of Laminate 9]

Laminate 9 was produced in the same manner as Laminate 7 except that, instead of H4, ZnS was used as the material for forming the second mask

[Production of Laminate 10]

Laminate 10 was produced in the same manner as Laminate 7 except that the laminate has a structure composed of five layers listed in TABLE II.

(B) Substrate: Substrate of glass type TAFDSG (manufactured by HOYA Corporation: refractive index 1.835)

(1) 1st layer: A 1st layer having a thickness of 31.7 nm was formed in the same manner as the layer forming method of the thin layer ($SiO_2$) used in the production of Laminate 1.

(2) 2nd layer: A 2nd layer having a thickness of 30.1 nm was formed on the 1st layer at a layer forming rate of 3 Å/sec by vapor-deposition of $Ta_2O_5$ (manufactured by Canon Optron, Product name: OA-600) as the layer forming material in the fifth evaporation source.

(3) 3rd layer: A 3rd layer having a thickness of 30.6 nm was formed in the same manner as the layer forming method of the thin layer ($SiO_2$) used in the production of Laminate 1.

(4) 4th layer: A 4th layer having a thickness of 113 nm was formed in the same manner as the layer forming method of the photocatalytic layer ($TiO_2$) used in the production of Laminate 1.

(5) 5th layer: A 5th layer having a thickness of 88 nm was formed in the same manner as the layer forming method of the thin layer ($SiO_2$ and $Na_2O$) used in the production of Laminate 5

[Production of Laminate 11]

Laminate 11 was produced in the same manner as Laminate 10 except that, before etching of the thin layer on which the first mask and the second mask have been formed, annealing was performed at 300° C. for five minutes under vacuum.

[Production of Laminate 12]

Laminate 12 was produced in the same manner as Laminate 10 except that the laminate has a structure composed of nine layers listed in TABLE III.

(B) Substrate: Substrate of glass type TAFDSG (manufactured by HOYA Corporation: refractive index 1.835)

(1) 1st layer: A 1st layer composed of $SiO_2$ and having a thickness of 29 nm was formed in the same manner as the layer forming method of the 1st layer of Laminate 10.

(2) 2nd layer: A 2nd layer composed of OA-600 and having a thickness of 35 nm was formed in the same manner as the layer forming method of the 2nd layer of Laminate 10.

(3) 3rd layer: A 3rd layer composed of $SiO_2$ and having a thickness of 30 nm was formed in the same manner as the layer forming method of the 3rd layer of Laminate 10.

(4) 4th layer: A 4th layer composed of $TiO_2$ and having a thickness of 121 nm was formed in the same manner as the layer forming method of the 4th layer of Laminate 10.

(5) 5th layer: A 5th layer composed of $SiO_2$ and $Na_2O$ having a thickness of 54 nm was formed in the same manner as the layer forming method of the 5th layer of Laminate 10.

(6) 6th layer: A 6th layer composed of $TiO_2$ and having a thickness of 3 nm was formed in the same manner as the layer forming method of the 4th layer of Laminate 10.

(7) 7th layer: A 7th layer composed of $SiO_2$ and $Na_2O$ having a thickness of 16 nm was formed in the same manner as the layer forming method of the 5th layer of Laminate 10.

(8) 8th layer: A 8th layer composed of $TiO_2$ and having a thickness of 3 nm was formed in the same manner as the layer forming method of the 4th layer of Laminate 10.

(9) 9th layer: A 9th layer composed of $SiO_2$ and $Na_2O$ having a thickness of 8 nm was formed in the same manner as the layer forming method of the 5th layer of Laminate 10.

[Production of Laminate 13]

Laminate 13 was produced in the same manner as Laminate 10 except that the laminate has a structure composed of eight layers listed in TABLE IV.

(B) Substrate: Substrate of glass type TAFDSG (manufactured by HOYA Corporation: refractive index 1.835)

(1) 1st layer: A 1st layer composed of $SiO_2$ and having a thickness of 29 nm was formed in the same manner as the layer forming method of the 1st layer of Laminate 10.

(2) 2nd layer: A 2nd layer composed of OA-600 and having a thickness of 35 nm was formed in the same manner as the layer forming method of the 2nd layer of Laminate 10.

(3) 3rd layer: A 3rd layer composed of $SiO_2$ and having a thickness of 30 nm was formed in the same manner as the layer forming method of the 3rd layer of Laminate 10.

(4) 4th layer: A 4th layer composed of $TiO_2$ and having a thickness of 121 nm was formed in the same manner as the layer forming method of the 4th layer of Laminate 10.

(5) 5th layer: A 5th layer composed of $SiO_2$ and having a thickness of 20 nm was formed in the same manner as the layer forming method of the 3rd layer of Laminate 10.

(6) 6th layer: A 6th layer composed of $SiO_2$ and $Na_2O$ having a thickness of 23 nm was formed in the same manner as the layer forming method of the 5th layer of Laminate 10.

(7) 7th layer: A 7th layer composed of $SiO_2$ and $Na_2O$ having a thickness of 23 nm was formed in the same manner as the layer forming method of the 5th layer of Laminate 10.

(8) 8th layer: A 8th layer composed of $SiO_2$ and $Na_2O$ having a thickness of 23 nm was formed in the same manner as the layer forming method of the 5th layer of Laminate 10.

[Production of Laminate 14 to Laminate 17]

Laminate 14 to 17 were each produced in the same manner as Laminate 3 except that the first mask and the second mask had the respective layer thicknesses shown in TABLE I.

TABLE I to TABLE IV show the structures of the respective laminates produced as described above.

TABLE I

| | LAYER STRUCTURE OF LAMINATE | | | | | | | | | |
|---|---|---|---|---|---|---|---|---|---|---|
| | PHOTOCATALYTIC LAYER | | THIN LAYER | | FIRST MASK | | SECOND MASK | | | |
| LAMINATE NUMBER | MATERIAL | LAYER THICKNESS [nm] | MATERIAL | LAYER THICKNESS [nm] | MATERIAL | LAYER THICKNESS [nm] | MATERIAL | LAYER THICKNESS [nm] | ANNEALING PROCESS | REMARKS |
| 1 | TiO$_2$ | 115 | SiO$_2$ | 88 | Ag | 10 | — | — | NOT PERFORMED | COMPARATIVE EXAMPLE |
| 2 | TiO$_2$ | 115 | SiO$_2$ | 88 | Ag | 39 | — | — | NOT PERFORMED | COMPARATIVE EXAMPLE |
| 3 | TiO$_2$ | 115 | SiO$_2$ | 88 | Ag | 39 | H4 | 1 | NOT PERFORMED | PRESENT INVENTION |
| 4 | TiO$_2$ | 115 | SiO$_2$ | 88 | Ag | 39 | H4 | 1 | PERFORMED | PRESENT INVENTION |
| 5 | TiO$_2$ | 115 | SiO$_2$•Na(10 mass %) | 88 | Ag | 7 | H4 | 1 | NOT PERFORMED | PRESENT INVENTION |
| 6 | TiO$_2$ | 115 | SiO$_2$•Na(10 mass %) | 88 | Ag | 39 | H4 | 10 | NOT PERFORMED | PRESENT INVENTION |
| 7 | TiO$_2$ | 115 | SiO$_2$•Na(10 mass %) | 88 | Ag | 39 | H4 | 1 | NOT PERFORMED | PRESENT INVENTION |
| 8 | TiO$_2$ | 115 | SiO$_2$•Na(10 mass %) | 88 | Ag | 39 | H4 | 1 | PERFORMED | PRESENT INVENTION |
| 9 | TiO$_2$ | 115 | SiO$_2$•Na(10 mass %) | 88 | Ag | 39 | ZnS | 1 | NOT PERFORMED | PRESENT INVENTION |
| 10 | LAYER STRUCTURE IN TABLE II (FIVE LAYERS) | | | | Ag | 39 | H4 | 1 | NOT PERFORMED | PRESENT INVENTION |
| 11 | LAYER STRUCTURE IN TABLE II (FIVE LAYERS) | | | | Ag | 39 | H4 | 1 | PERFORMED | PRESENT INVENTION |
| 12 | LAYER STRUCTURE IN TABLE III (NINE LAYERS) | | | | Ag | 39 | H4 | 1 | NOT PERFORMED | PRESENT INVENTION |
| 13 | LAYER STRUCTURE IN TABLE IV (EIGHT LAYERS) | | | | Ag | 39 | H4 | 1 | NOT PERFORMED | PRESENT INVENTION |
| 14 | TiO$_2$ | 115 | SiO$_2$ | 88 | Ag | 0.5 | H4 | 1 | NOT PERFORMED | PRESENT INVENTION |
| 15 | TiO$_2$ | 115 | SiO$_2$ | 88 | Ag | 120 | H4 | 1 | NOT PERFORMED | PRESENT INVENTION |
| 16 | TiO$_2$ | 115 | SiO$_2$ | 88 | Ag | 39 | H4 | 0.01 | NOT PERFORMED | PRESENT INVENTION |
| 17 | TiO$_2$ | 115 | SiO$_2$ | 88 | Ag | 39 | H4 | 12 | NOT PERFORMED | PRESENT INVENTION |

TABLE II

LAYER STRUCTURE OF LAMINATE 10

| | MATERIAL | LAYER THICKNESS [nm] |
|---|---|---|
| 5th LAYER | SiO$_2$•Na(10 mass %) | 88 |
| 4th LAYER | TiO$_2$ | 113 |
| 3rd LAYER | SiO$_2$ | 30.6 |
| 2nd LAYER | OA-600 | 30.1 |
| 1st LAYER | SiO$_2$ | 31.7 |
| SUBSTRATE | TAFD5G | |

TABLE III

LAYER STRUCTURE OF LAMINATE 12

| | MATERIAL | LAYER THICKNESS [nm] |
|---|---|---|
| 9th LAYER | SiO$_2$•Na(10 mass %) | 8 |
| 8th LAYER | TiO$_2$ | 3 |
| 7th LAYER | SiO$_2$•Na(10 mass %) | 16 |
| 6th LAYER | TiO$_2$ | 3 |
| 5th LAYER | SiO$_2$•Na(10 mass %) | 54 |
| 4th LAYER | TiO$_2$ | 121 |
| 3rd LAYER | SiO$_2$ | 30 |
| 2nd LAYER | OA-600 | 35 |
| 1st LAYER | SiO$_2$ | 29 |
| SUBSTRATE | TAFD5G | |

TABLE IV

LAYER STRUCTURE OF LAMINATE 13

| | MATERIAL | LAYER THICKNESS [nm] |
|---|---|---|
| 8th LAYER | SiO$_2$•Na(10 mass %) | 23 |
| 7th LAYER | SiO$_2$•Na(10 mass %) | 23 |
| 6th LAYER | SiO$_2$•Na(10 mass %) | 23 |
| 5th LAYER | SiO$_2$ | 20 |
| 4th LAYER | TiO$_2$ | 121 |
| 3rd LAYER | SiO$_2$ | 30 |
| 2nd LAYER | OA-600 | 35 |
| 1st LAYER | SiO$_2$ | 29 |
| SUBSTRATE | TAFD5G | |

<<Evaluation of Dielectric Multilayer>>

(1) Evaluation of Photocatalytic Effect: Expression of Effects as Photocatalyst

The "photocatalytic effect" was evaluated step by step as follows: after leaving a sample colored with a pen in a high temperature and high humidity (85° C. and 85% RH) environment for 1000 hours, the sample was irradiated with UV rays (integrated light amount: 20 J) at a temperature of 20° C. and a humidity of 80% RH, and color change of the sample colored with the pen by oxidizing radical species etc. due to photocatalytic effect was evaluated step by step. Specifically, The Visuallizer (manufactured by Ink Intelligent) was used as the pen. The photocatalytic effect was evaluated as follows.

AA: Excellent photocatalytic effect (The color change after UV irradiation was large, and the color of the pen completely disappeared.)

BB: Good photocatalytic effect (The color of the pen almost disappeared after UV irradiation.)

CC: Practically acceptable photocatalytic effect (The color of the pen remained slightly after UV irradiation.)

DD: Insufficient photocatalytic effect (The color of the pen obviously remained after UV irradiation)

(2) Evaluation of Residual Mask

After removing the masks from the laminate, the fine structure surface of the thin layer was observed using a Surface Roughness Analysis 3D Scanning Electron Microscope "ERA-600" manufactured by Elionix Inc. The residual mask was evaluated as follows.

AA: No first mask material remained on the fine structure surface of the thin layer.

BB: Almost no first mask material remained on the fine structure surface of the thin layer.

CC: First mask material slightly remained on the fine structure surface of the thin layer but caused no problem in practical use.

DD: First mask material clearly remained on the fine structure surface of the thin layer.

(3) Shape Evaluation of Fine Structure of Thin Layer

After removing the masks from the laminate, the fine structure surface of the thin layer was observed using a Surface Roughness Analysis 3D Scanning Electron Microscope "ERA-600" manufactured by Elionix Inc. The shape of fine structure was evaluated as follows.

AA: The fine structure of the thin layer had a good shape with no defects or irregular shapes.

BB: The fine structure of the thin layer had a good shape with almost no defects or irregular shapes.

CC: The fine structure of the thin layer had a practically acceptable shape though occurrence of very small defects and irregular shapes were observed.

DD: The fine structure of the thin layer had a practically problematic shape with obviously recognized occurrence of defects and irregular shapes.

TABLE V shows the evaluation results.

TABLE V

| LAMINATE NUMBER | EVALUATION RESULT | | | REMARKS |
| --- | --- | --- | --- | --- |
| | PHOTOCATALYTIC EFFECT | RESIDUAL MASK | FINE STRUCTURE IN THIN LAYER | |
| 1 | CC | DD | DD | COMPARATIVE EXAMPLE |
| 2 | DD | CC | DD | COMPARATIVE EXAMPLE |
| 3 | BB | BB | BB | PRESENT INVENTION |
| 4 | BB | BB | AA | PRESENT INVENTION |
| 5 | BB | AA | BB | PRESENT INVENTION |
| 6 | AA | BB | AA | PRESENT INVENTION |
| 7 | AA | BB | BB | PRESENT INVENTION |
| 8 | AA | BB | AA | PRESENT INVENTION |
| 9 | AA | BB | BB | PRESENT INVENTION |
| 10 | AA | BB | BB | PRESENT INVENTION |
| 11 | AA | BB | AA | PRESENT INVENTION |
| 12 | AA | BB | BB | PRESENT INVENTION |
| 13 | AA | BB | BB | PRESENT INVENTION |
| 14 | BB | BB | CC | PRESENT INVENTION |
| 15 | CC | BB | CC | PRESENT INVENTION |
| 16 | BB | CC | BB | PRESENT INVENTION |
| 17 | BB | BB | CC | PRESENT INVENTION |

According to the results shown in TABLE V, it is clear that the laminate having the thin layer with a fine structure pattern using the first mask and the second mask according to the present invention has a better photocatalytic effect and less residual mask than the laminate of the comparative example. It is also clear that the second mask covers the first mask to avoid damages during the dry etching, whereby a fine structure having no defects can be formed in the thin layer. Furthermore, it is clear that the annealing performed before etching of the thin layer for forming pores after formation of the first mask and the second mask has an excellent effect in forming the fine structure.

The invention claimed is:

1. A forming method of a thin layer with a pore, comprising:
   forming a thin layer on a substrate;
   stacking a first mask and a second mask on the thin layer in this order to form a pattern, the first mask including at least a self-assembling material and the second mask being more resistant to reactive etching or physical etching than the first mask; and
   forming a pore in the thin layer by dry etching,
   wherein the pattern is formed without an exposure to light, and
   the self-assembling material is a metal.

2. The forming method of a thin layer according to claim 1, further comprising:
   after stacking the first mask and the second mask, expanding a hole in the first mask through which the thin layer is exposed.

3. The forming method of a thin layer according to claim 2, wherein the hole is expanded by annealing at a temperature of 100° C. or more for one minute or more.

4. The forming method of a thin layer according to claim 1, wherein the self-assembling material is silver.

5. The forming method of a thin layer according to claim 1, wherein the first mask has a portion in a particulate shape, a leaf vein shape, or a porous shape.

6. The forming method of a thin layer according to claim 1, wherein the first mask has a layer thickness in a range of 1 to 100 nm.

7. The forming method of a thin layer according to claim 1, wherein the second mask is formed using a material including at least one of a mixture of $Ta_2O_5$ and $TiO_2$, ZnS, LaF, YF, CeF, WO, and $SiO_2$.

8. The forming method of a thin layer according to claim 1, wherein the second mask is formed using a material including ZnS or a mixture of $Ta_2O_5$ and $TiO_2$.

9. The forming method of a thin layer according to claim 1, wherein the second mask has a layer thickness in a range of 0.1 to 10 nm.

10. The forming method of a thin layer according to claim 1, wherein the first mask and the second mask are formed by a vacuum deposition method.

11. The forming method of a thin layer according to claim 1, wherein the thin layer includes $SiO_2$ as a main component.

12. The forming method of a thin layer according to claim 1, wherein the thin layer is formed on the substrate with a photocatalytic layer between the thin layer and the substrate, the photocatalytic layer includes at least one of $TiO_2$, $WO_3$, ZnS, and ZnO.

13. The forming method of a thin layer according to claim 1, further comprising:
    forming an antireflection layer unit between the substrate and the thin layer, the antireflection layer unit including at least one low refractive index layer and at least one high refractive index layer.

14. The forming method of a thin layer according to claim 1, wherein the self-assembling material autonomously forms a hole.

15. The forming method of a thin layer according to claim 1, wherein the hole has a width of 10 μm or less.

* * * * *